(12) United States Patent
Tan et al.

(10) Patent No.: US 8,533,651 B1
(45) Date of Patent: Sep. 10, 2013

(54) PROVIDING CONVERSION OF A PLANAR DESIGN TO A FINFET DESIGN

(75) Inventors: Soon Yoeng Tan, Wappingers Falls, NY (US); Angeline Ho, Johor (MY); Hendry Renaldo, Singapore (SG); Andreas Knorr, Wappingers Falls, NY (US); Scott Johnson, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/552,313

(22) Filed: Jul. 18, 2012

(51) Int. Cl.
*G06F 17/50* (2006.01)

(52) U.S. Cl.
CPC ........ *G06F 17/5072* (2013.01); *G06F 17/5077* (2013.01)
USPC ........... 716/122; 716/123; 716/129; 716/130; 716/103; 716/104

(58) Field of Classification Search
CPC .................... G06F 17/5072; G06F 17/5077
USPC ................. 716/123, 129, 130, 103, 104, 122
See application file for complete search history.

(56) References Cited

U.S. PATENT DOCUMENTS

| | | | | |
|---|---|---|---|---|
| 8,225,261 | B2 * | 7/2012 | Hong et al. | 716/122 |
| 8,356,268 | B2 * | 1/2013 | Becker et al. | 716/126 |
| 8,453,094 | B2 * | 5/2013 | Kornachuk et al. | 716/126 |
| 2011/0282478 | A1 * | 11/2011 | Shen et al. | 700/104 |
| 2011/0283245 | A1 * | 11/2011 | Shen et al. | 716/106 |
| 2012/0124528 | A1 * | 5/2012 | Wang et al. | 716/52 |
| 2012/0273899 | A1 * | 11/2012 | Wann et al. | 257/401 |
| 2012/0278776 | A1 * | 11/2012 | Lei et al. | 716/111 |
| 2012/0278777 | A1 * | 11/2012 | Lin et al. | 716/111 |
| 2012/0278781 | A1 * | 11/2012 | Wann et al. | 716/122 |
| 2012/0280331 | A1 * | 11/2012 | Ou et al. | 257/401 |
| 2013/0126978 | A1 * | 5/2013 | Becker et al. | 257/369 |

* cited by examiner

*Primary Examiner* — Phallaka Kik
(74) *Attorney, Agent, or Firm* — Ditthavong Mori & Steiner, P.C.

(57) ABSTRACT

An approach for providing conversion of a planar design to a FinFET design is disclosed. Embodiments include: receiving a planar design having a plurality of diffusion regions; overlapping a plurality of parallel fin mandrels with a plurality of evenly-spaced parallel lines of a grid; snapping the diffusion regions to the grid based on the parallel lines; and generating a FinFET design based on the overlapping and the snapping. Embodiments include the parallel lines and the parallel fin mandrels being perpendicular to a poly orientation associated with the planar design, and determining a spacing length between the parallel lines; determining a plurality of edges of the diffusion regions that are parallel to the poly orientation; and cropping the diffusion regions until each of the edges has a length that is a multiple of the spacing length.

20 Claims, 11 Drawing Sheets

PROVIDING CONVERSION OF A PLANAR DESIGN TO A FINFET DESIGN

TECHNICAL FIELD

The present disclosure relates to fin-based field-effect transistor (FinFET) designs. The present disclosure is particularly applicable to FinFET designs in 20 nanometer (nm) technology nodes and beyond.

BACKGROUND

FinFET is a recent technology pioneered for 20 nm technology nodes and beyond. Compared with traditional designs (e.g., planar complementary metal-oxide-semiconductor (CMOS) designs), FinFET designs can offer much greater performance with significantly lower leakage. However, the FinFET design process is typically complex, and mask and other development costs associated with advanced technology nodes are astronomical.

A need therefore exists for cheaper development of FinFET designs, and enabling methodology, such as providing conversion of a planar design to a FinFET design.

SUMMARY

An aspect of the present disclosure is a method for implementing conversion of a planar design to FinFET design.

Another aspect of the present disclosure is an apparatus for implementing conversion of a planar design to FinFET design.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: receiving a planar design having a plurality of diffusion regions; overlapping a plurality of parallel fin mandrels with a plurality of evenly-spaced parallel lines of a grid; snapping the diffusion regions to the grid based on the parallel lines; and generating a FinFET design based on the overlapping and the snapping.

An aspect of the present disclosure includes the parallel lines and the parallel fin mandrels being perpendicular to a poly orientation associated with the planar design. Additional aspects include: determining a spacing length between the parallel lines; determining a plurality of edges of the diffusion regions that are parallel to the poly orientation; and cropping the diffusion regions until each of the edges has a length that is a multiple of the spacing length, wherein the snapping is additionally based on the cropped diffusion regions. Further aspects include: determining that at least one of the edges has an edge length less than the spacing length; and removing at least one of the diffusion regions having the at least one edge. Moreover, some aspects include the spacing length being 40 nm to 50 nm.

Certain aspects include: drawing an exclusion region that replaces at least one of the diffusion regions; and drawing a plurality of other parallel fin mandrels within the exclusion region, wherein the generation of the FinFET design is additionally based on the drawing of the other parallel fin mandrels and the exclusion region. Various aspects include: determining a keep-away region of the exclusion region based on a keep-away distance of the exclusion region; and removing portions of the fin mandrels that are within the keep-away region, wherein the generation of the FinFET design is additionally based on the removal of the fin mandrel portions. Some aspects include the diffusion regions having drawn diffusion regions and dummy fill diffusion regions. Additional aspects include: determining another keep-away region separating the drawn diffusion regions from the dummy fill diffusion regions; and generating additional dummy fill diffusion regions in the another keep-away region, the additional dummy fill diffusion regions being spaced from the drawn diffusion regions by at least the keep away distance, wherein the generation of the FinFET design is additionally based on the additional dummy fill diffusion regions. Another aspect includes the keep-away distance being 250 nm to 700 nm. Further aspects include: overlapping the parallel fin mandrels with the parallel lines by centering each of the parallel fin mandrels over a different line of the parallel lines.

An additional aspect of the present disclosure is an apparatus including a processor, and a memory including computer program code for one or more computer programs, the memory and the computer program code configured to, with the processor, cause the apparatus to: receive a planar design having a plurality of diffusion regions; overlap a plurality of parallel fin mandrels with a plurality of evenly-spaced parallel lines of a grid; snap the diffusion regions to the grid based on the parallel lines; and generate a FinFET design based on the overlapping and the snapping.

An aspect includes the parallel lines and the parallel fin mandrels being perpendicular to a poly orientation associated with the planar design. Some aspects include the apparatus being further caused to: determine a spacing length between the parallel lines; determine a plurality of edges of the diffusion regions that are parallel to the poly orientation; and crop the diffusion regions until each of the edges has a length that is a multiple of the spacing length, wherein the snapping is additionally based on the cropped diffusion regions. Other aspects include the apparatus being further caused to: determine that at least one of the edges has an edge length less than the spacing length; and remove at least one of the diffusion regions having the at least one edge.

Certain aspects include the apparatus being further caused to: draw an exclusion region that replaces at least one of the diffusion regions; and draw a plurality of other parallel fin mandrels within the exclusion region, wherein the generation of the FinFET design is additionally based on the drawing of the other parallel fin mandrels and the exclusion region. Various aspects include the apparatus being further caused to: determine a keep-away region of the exclusion region based on a keep-away distance of the exclusion region; and remove portions of the fin mandrels that are within the keep-away region, wherein the generation of the FinFET design is additionally based on the removal of the fin mandrel portions. Some aspects include the diffusion regions having drawn diffusion regions and dummy fill diffusion regions. Further aspects include the apparatus being further caused to: determine another keep-away region separating the drawn diffusion regions from the dummy fill diffusion regions; and generate additional dummy fill diffusion regions in the another keep-away region, the additional dummy fill diffusion regions being spaced from the drawn diffusion regions by at least the keep away distance, wherein the generation of the FinFET design is additionally based on the additional dummy fill diffusion regions.

Another aspect of the present disclosure includes: receiving a planar design having a diffusion layer that includes a plurality of diffusion regions; overlaying a grid and the diffusion layer, wherein the grid has a plurality of evenly-spaced parallel lines that are perpendicular to a poly orientation associated with the planar design; overlapping a plurality of parallel fin mandrels with the parallel lines, wherein the parallel fin mandrels are parallel to the parallel lines; snapping the diffusion regions to the grid based on the parallel lines; and generating a FinFET design based on the overlapping and the snapping. Additional aspects include: determining a spacing length between the parallel lines; determining a plurality of edges of the diffusion regions that are parallel to the poly orientation; and cropping the diffusion regions until each of the edges has an edge length that is a multiple of the spacing length, wherein the snapping is additionally based on the cropped diffusion regions.

Various aspects include: drawing an exclusion region that replaces at least one of the diffusion regions; manually drawing a plurality of other parallel fin mandrels within the exclusion region; determining a keep-away region of the exclusion region based on a keep-away distance of the exclusion region; and removing portions of the fin mandrels that are within the keep-away region, wherein the generation of the FinFET design is additionally based on the drawing of the other parallel fin mandrels and the exclusion region, and the removal of the fin portions. Some aspects include the diffusion regions having drawn diffusion regions and dummy fill diffusion regions. Further aspects include: determining another keep-away region separating the drawn diffusion regions from the dummy fill diffusion regions; and generating additional dummy fill diffusion regions in the another keep-away region, the additional dummy fill diffusion regions being spaced from the drawn diffusion regions by at least the keep away distance, wherein the generation of the FinFET design is additionally based on the additional dummy fill diffusion regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of design complexities and costs associated with FinFET design. The present disclosure addresses and solves such problems, for instance, by, inter alia, providing a simple, low-cost conversion from a planar design to a FinFET design.

Figure 1:
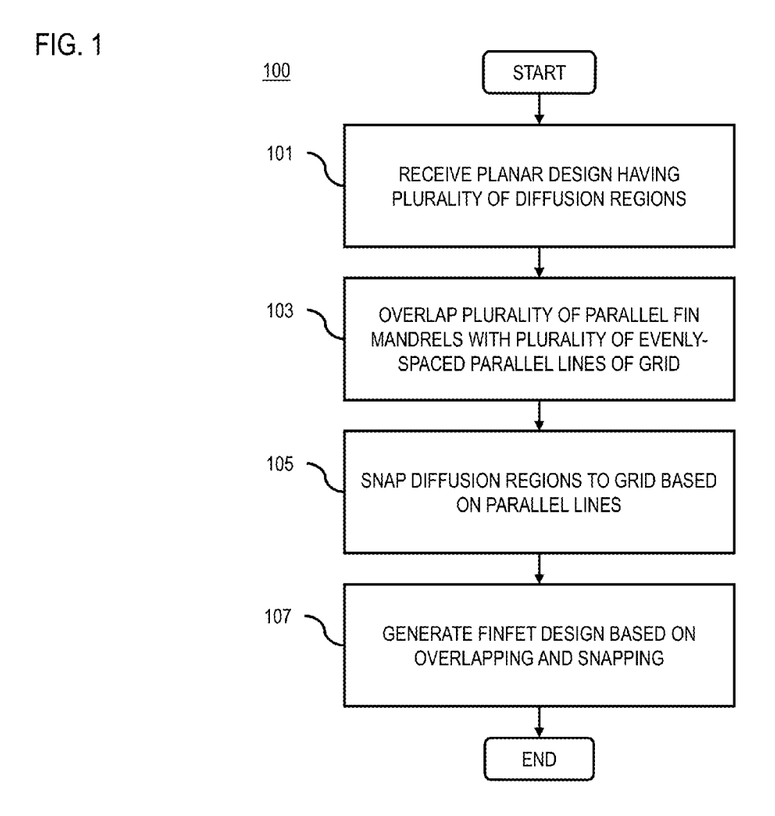
FIG. 1 is a flowchart of a process for providing conversion of a planar design to a FinFET design, in accordance with an exemplary embodiment of the present disclosure.
Figure 4:
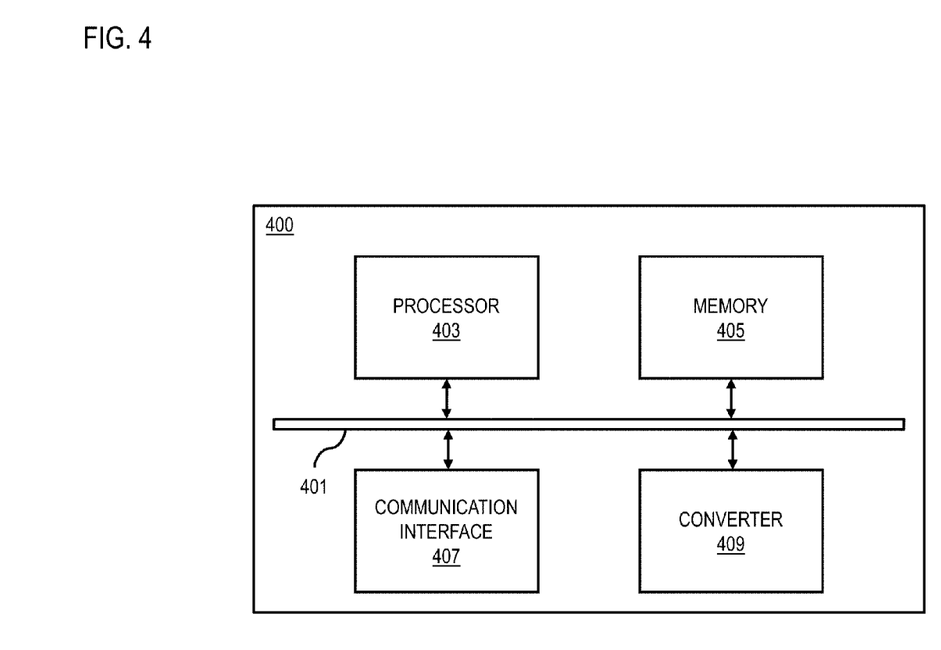
FIG. 4 schematically illustrates a computer system upon which an exemplary embodiment of the invention may be implemented.

FIG. 1 is a flowchart of a process 100 for providing conversion of a planar design to a FinFET design, in accordance with an exemplary embodiment of the present disclosure. A finification platform may perform the process 100 and may be implemented in, for instance, a computer system including a processor and a memory as shown in FIG. 4. Adverting to FIG. 1, in step 101, the finification platform may receive a planar design having a plurality of diffusion regions. In one scenario, for instance, the planar design may have a diffusion layer that includes the diffusion regions. As such, a global grid may be introduced on the entire diffusion layer of the planar design, for instance, by overlaying the global grid and the diffusion layer.

In step 103, the finification platform may overlap a plurality of parallel fin mandrels with a plurality of evenly-spaced parallel lines of a grid (e.g., the global grid). By way of example, the finification platform may overlap the parallel fin mandrels with the parallel lines by centering each of the parallel fin mandrels over a different line of the parallel lines. The parallel fin mandrels and the parallel lines may, for example, be perpendicular to a poly orientation associated with the planar design. As used herein, poly orientation (or poly gate orientation) refers to the orientation of a critical front-end poly layer, for instance, that is determined by the designer. Then, design generation rules of other layers are generally based on the poly orientation.

In step 105, the finification platform may snap the diffusion regions to the grid based on the parallel lines. The snapping may additionally be based on a cropping of the diffusion regions. For example, the finification platform may determine a spacing length between the parallel lines (e.g., the spacing length being 40 nm to 50 nm). The finification platform may then determine a plurality of edges of the diffusion regions that are parallel to the poly orientation, and crop the diffusion regions until each of the edges has a length that is a multiple of the spacing length. In one scenario, the spacing length between vertical parallel grid lines may be 48 nm, and a rectangular diffusion region may have two horizontal edges that are less than 48 nm in length. The cropping may cause the two vertical edges of the diffusion region to appear to merge inward toward the vertical center of the diffusion region. As such, the cropping may result in the removal of the diffusion region (e.g., where the multiple of the spacing length reached is 0). In a further scenario, a second rectangular diffusion region may have horizontal edges that are greater than twice the spacing length. The cropping may, for instance, cause the two vertical edges of the diffusion regions to merge inward toward the vertical center of the diffusion region until each of the vertical edges "snaps" onto one of the parallel grid lines (e.g., where the multiple of the spacing length reached is 2).

The finification platform may alternatively determine that at least one of the edges has an edge length less than the spacing length, and remove at least one of the diffusion regions having the at least one edge based on such determination. For example, a rectangular diffusion region with horizontal edges that are less than 48 nm may be removed without the need for cropping where the spacing length between the vertical parallel grid lines is 48 nm. Further, the snapping process may include automatic removal of certain diffusion regions based on such a determination.

In step 107, the finification platform may then generate a FinFET design based on the overlapping and the snapping. The generation of the FinFET design may additionally be based on the drawing of various exclusion regions for specially handled areas where diffusion regions will be removed and fin mandrels are drawn by hand. Thus, the finification platform may draw an exclusion region that replaces at least one of the diffusion regions, and draw a plurality of other parallel fin mandrels (e.g., custom fin mandrels based on hand-drawn fin mandrels as opposed to the global fin mandrels) within the exclusion region. Moreover, a keep-away region may be utilized to keep the global fin mandrels away from the exclusion region. As such, the finification platform may determine a keep-away region of the exclusion region based on a keep-away distance (e.g., 250 nm to 700 nm) of the exclusion region, and remove portions of the parallel fin mandrels (e.g., the global fin mandrels) that are within the keep-away region. In this way, a robust, low-cost solution that converts a planar design to a FinFET design may be realized, for instance, with only a few mask changes. As such, greater power performance associated with FinFET designs may be achieved without significant design and mask costs.

Figure 2:
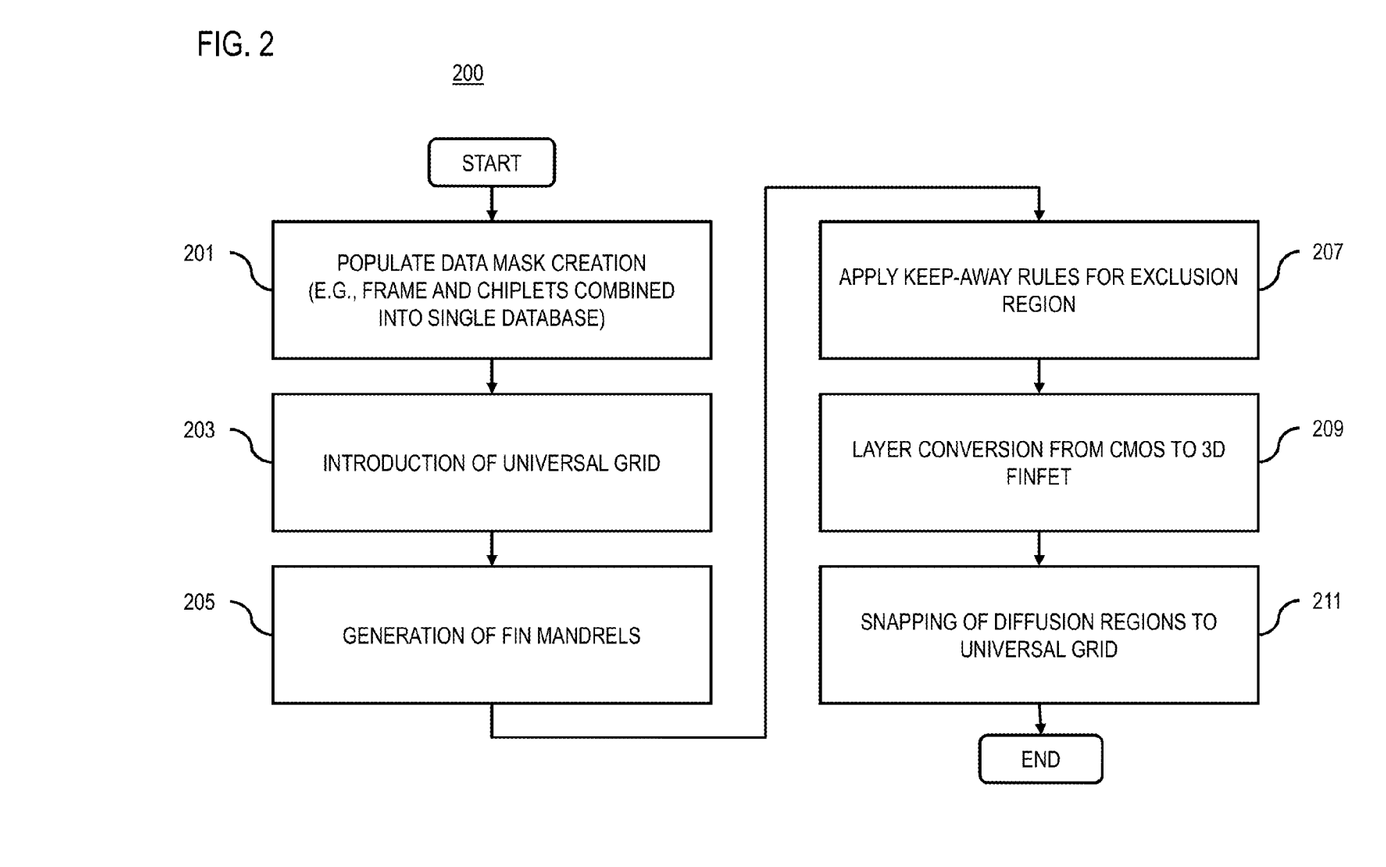
FIG. 2 is a flowchart of a process for providing conversion of a planar CMOS design to a FinFET design, in accordance with an exemplary embodiment of the present disclosure.

FIG. 2 is a flowchart of a process 200 for providing conversion of a planar CMOS design to a FinFET design, in accordance with an exemplary embodiment of the present disclosure. A finification platform may perform the process 200 and may be implemented in, for instance, a computer system including a processor and a memory as shown in FIG. 4. In step 201, the finification platform may populate data for mask creation to assemble the frame and the chiplets (associated with a planar CMOS design including a diffusion layer), for instance, as a single reticle prior to introduction of the universal grid. Upon such population, in step 203, the finification platform may then introduce the universal grid on the entire diffusion layer of the planar design. The universal grid may, for instance, include a plurality of parallel grid lines that are perpendicular to the poly orientation associated with the planar design.

In step 205, the finification platform may generate a plurality of parallel fin mandrels outside of exclusion regions (e.g., where various diffusion regions will be removed and custom fin mandrels are drawn by hand). In addition, the finification platform may draw custom fin mandrels inside the exclusion regions (e.g., based on hand-drawn custom fin mandrels by the designer). Generation of the parallel fin mandrels may include overlapping of the parallel fin mandrels with the parallel grid lines by centering each of the parallel fin mandrels over a different line of the parallel grid lines.

In step 207, the finification platform may apply keep-away rules to remove portions of the parallel fin mandrels from the universal grid that are within a keep-away distance (e.g., 250 nm to 700 nm) of an exclusion region, for instance, with respect to an orientation that is perpendicular to the poly orientation. In steps 209 and 211, the finification platform may initiate further layer conversion from the planar CMOS design to a three-dimensional FinFET design, which includes snapping of the diffusion regions (e.g., both drawn diffusion regions and dummy fill diffusion regions as explain with respect to FIG. 3H below) to the universal grid.

Figure 3A:
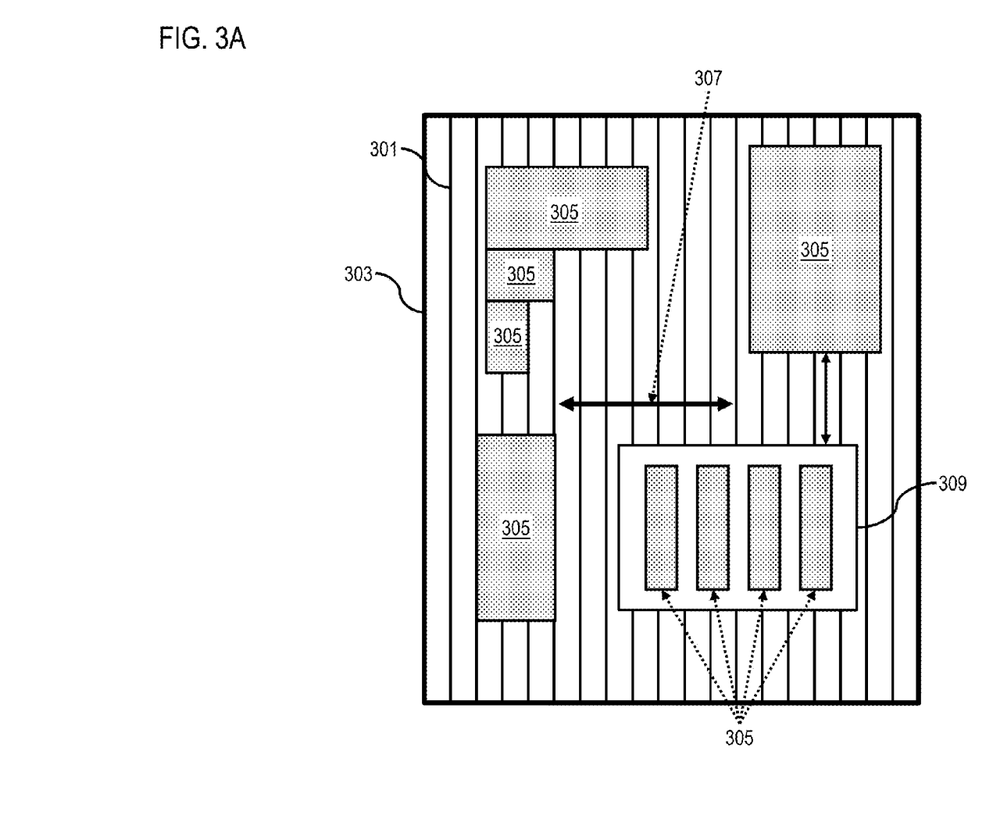
FIGS. 3A through 3H schematically illustrate various steps with respect to FIGS. 1 and 2, in accordance with various exemplary embodiments of the present disclosure.

FIGS. 3A through 3H schematically illustrate various steps with respect to FIGS. 1 and 2, in accordance with various exemplary embodiments of the present disclosure. For example, FIG. 3A illustrates the introduction of a universal grid 301 on the entire diffusion layer 303 of a planar design having a plurality of diffusion regions 305. As shown, the grid 301 has a plurality of evenly-spaced parallel lines that are perpendicular to a poly orientation (e.g., indicator 307) associated with the planar design. As discussed, the poly orientation (or poly gate orientation) is the orientation of a critical front-end poly layer, for instance, that is determined by the designer. As depicted, FIG. 3A also includes an exclusion region 309 that has been drawn that will cause the diffusion regions 305 within the drawn exclusion region 309 to be removed.

Figure 3B:
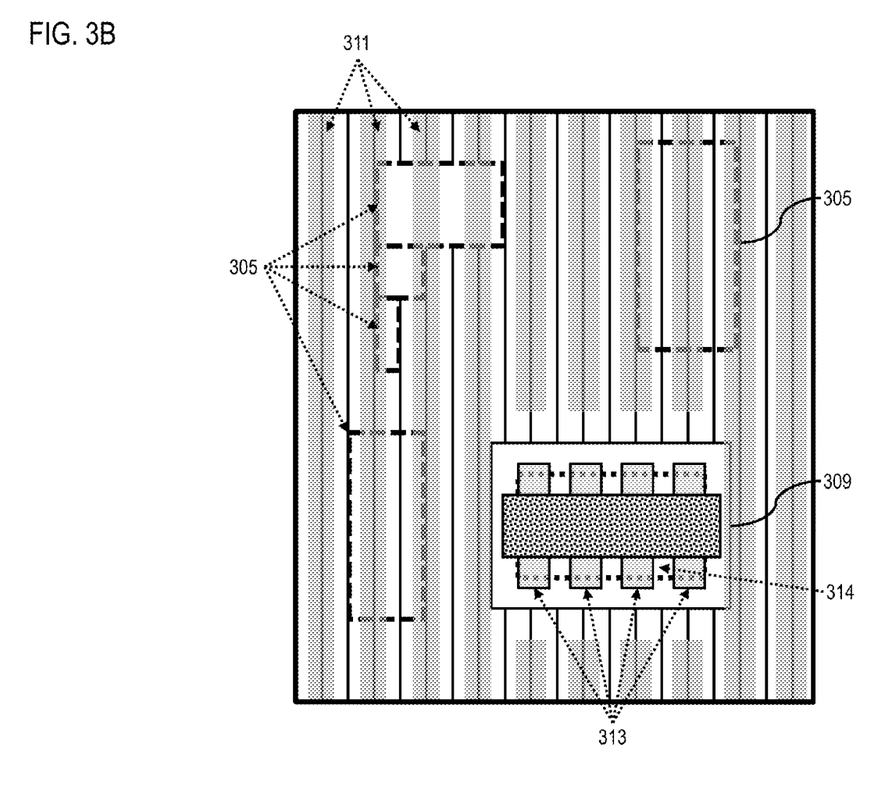

FIG. 3B illustrates the generation of parallel fin mandrels 311 that are overlapped with the parallel grid lines. Moreover, as shown, the diffusion regions 305 have also been "snapped" to the grid based on the parallel lines (e.g., by cropping the diffusion regions until each of the diffusion regions snaps to the parallel grid lines). Furthermore, as depicted, the diffusion regions 305 that previously overlapped with the exclusion region 309 have been removed, and custom fin mandrels 313 and custom diffusion region 314 (e.g., hand-drawn by the designer) have been drawn within the exclusion region 309 (where indicator 307 specifies the poly orientation).

Figure 3C:
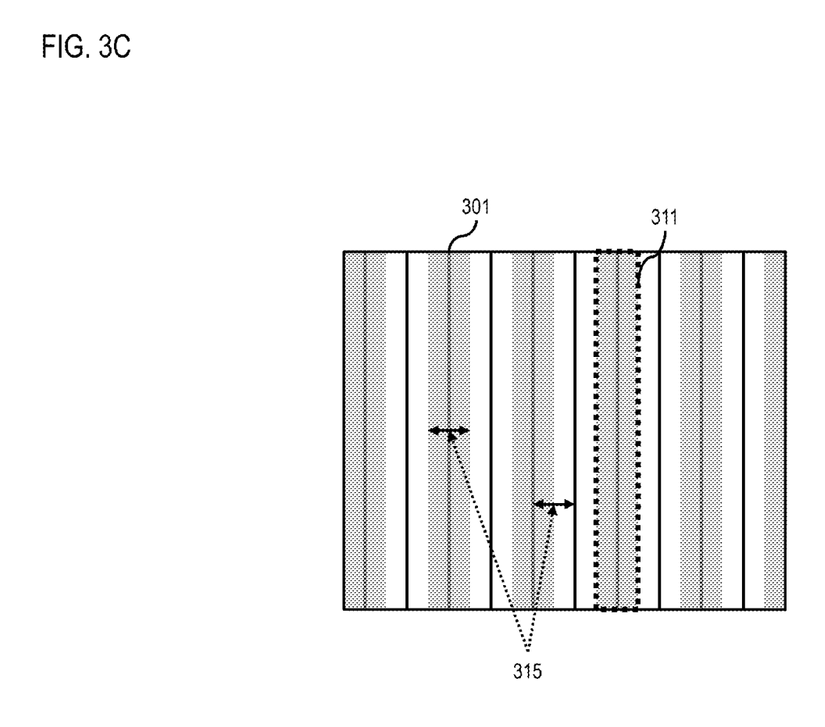
Figure 3D:
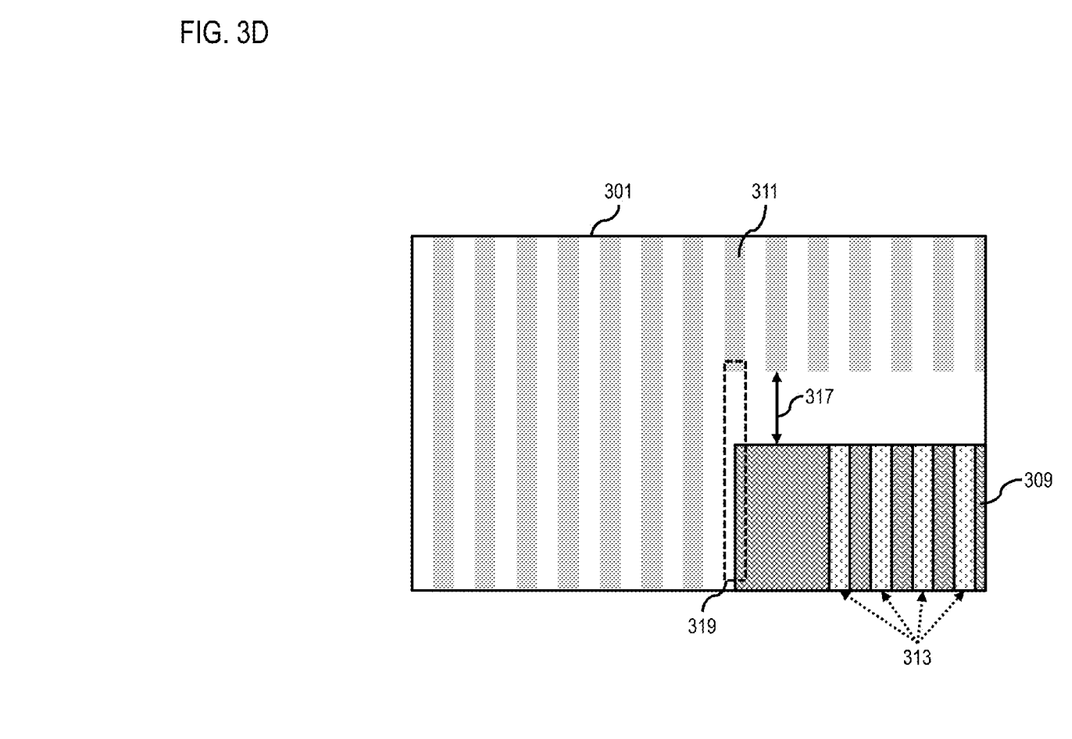

FIG. 3C illustrates that each of the parallel fin mandrels 311 is centered on a different parallel line of the grid 301. In this case, the spacing length (e.g., indicator 315) between the parallel lines is 48 nm, and the width (e.g., indicator 315) of each of the parallel fin mandrels 311 is also 48 nm. FIG. 3D illustrates a keep-away region based on a keep-away distance (e.g., indicator 317) of the exclusion region 309. In this case, the keep-away distance is 250 nm that is set at p-orientation (or an orientation that is perpendicular to the poly orientation) between the exclusion region and the universal fin mandrels 311. As such, portions of the universal fin mandrels 311 that are within the keep-away region are removed. In addition, as depicted, sub-nominal fin mandrels overlapping with the exclusion region 309 are also removed (e.g., indicator 319), for instance, based on a requirement that all of the universal fin mandrels 311 must have a particular width (e.g., 48 nm).

Figure 3E:
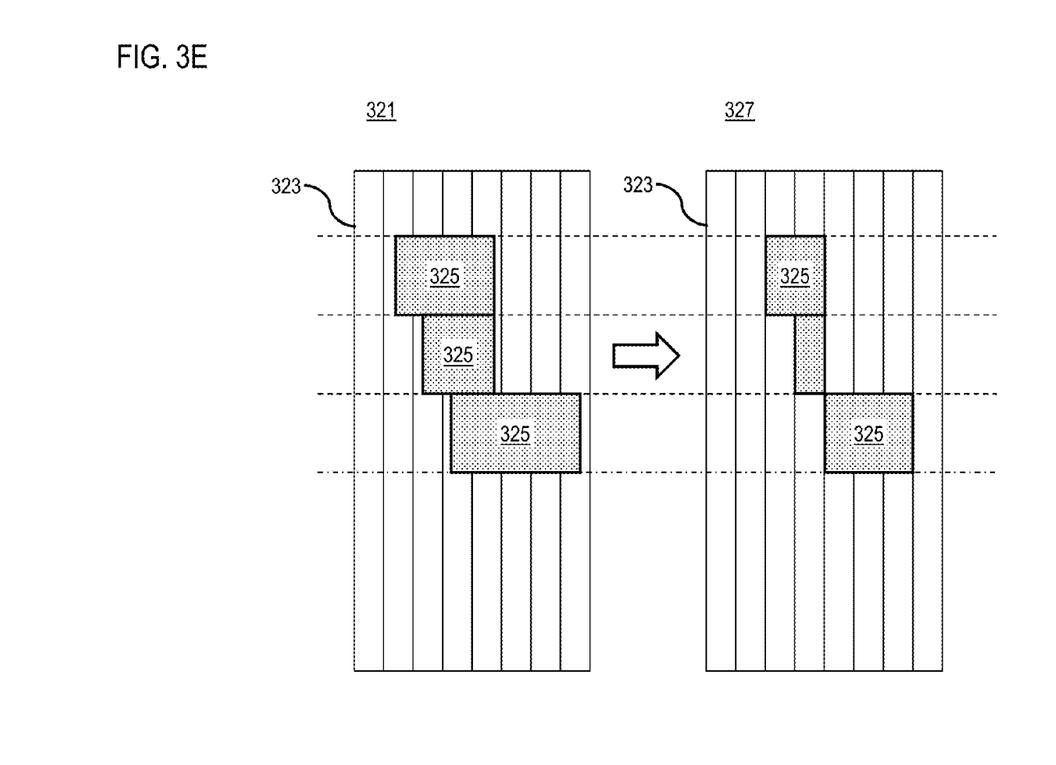
Figure 3F:
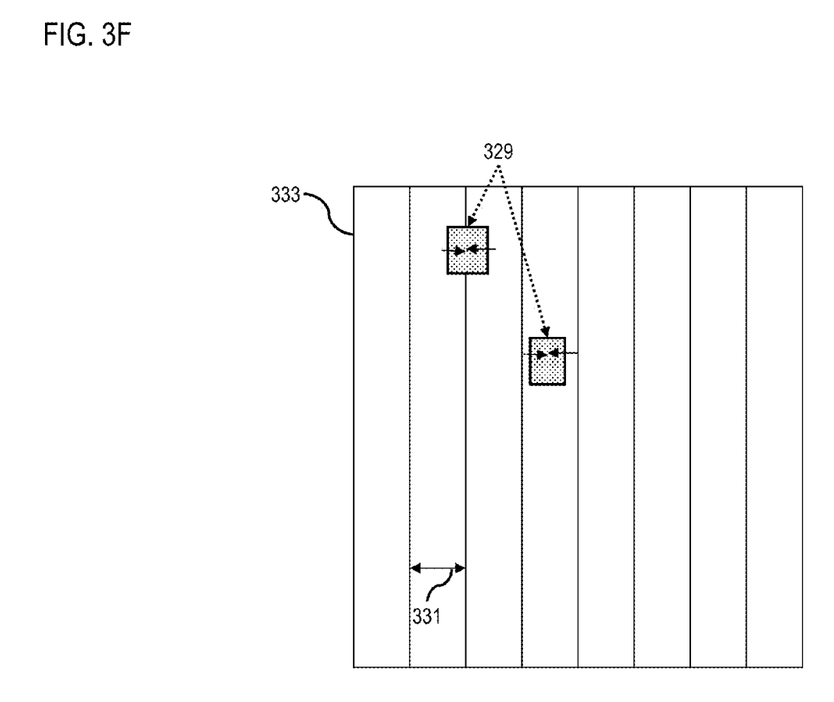

FIG. 3E illustrates additional details with respect to the snapping process. For example, diagram 321 depicts grid 323 and diffusion regions 325 before the snapping of the diffusion regions 325 to the grid 323, and diagram 327 depicts the grid 323 and the diffusion regions 325 after the snapping. In this case, during the snapping process, the diffusion regions 325 will be cropped by merging the vertical edges inwards until each of the vertical edges snaps to a parallel line of the grid 323. FIG. 3F illustrates the situation in which a diffusion region has edges parallel to the poly orientation with edge lengths less than the spacing length between parallel grid lines. In this case, for instance, the horizontal edges of diffusion regions 329 have a length that is less than the spacing length (e.g., indicator 331) between the parallel lines of grid 333. Thus, the vertical edges of the diffusion regions 329 will merge inward until the diffusion regions 329 disappear. Accordingly, such diffusion regions 329 may automatically be removed when it is determined that their edges that are parallel to the poly orientation are also less than the spacing length between the parallel grid lines.

Figure 3G:
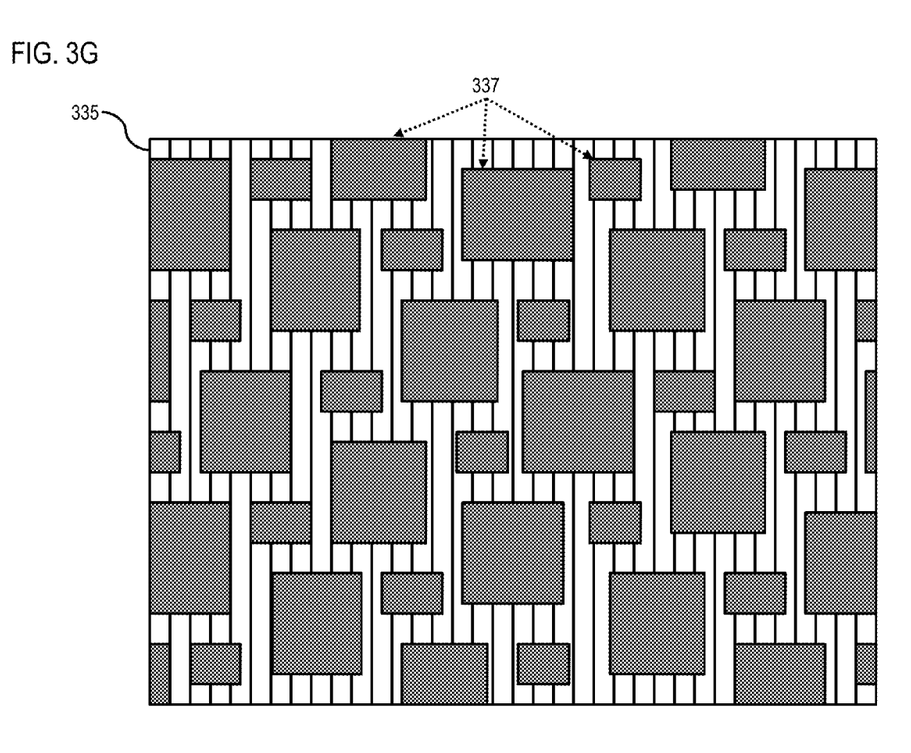
Figure 3H:
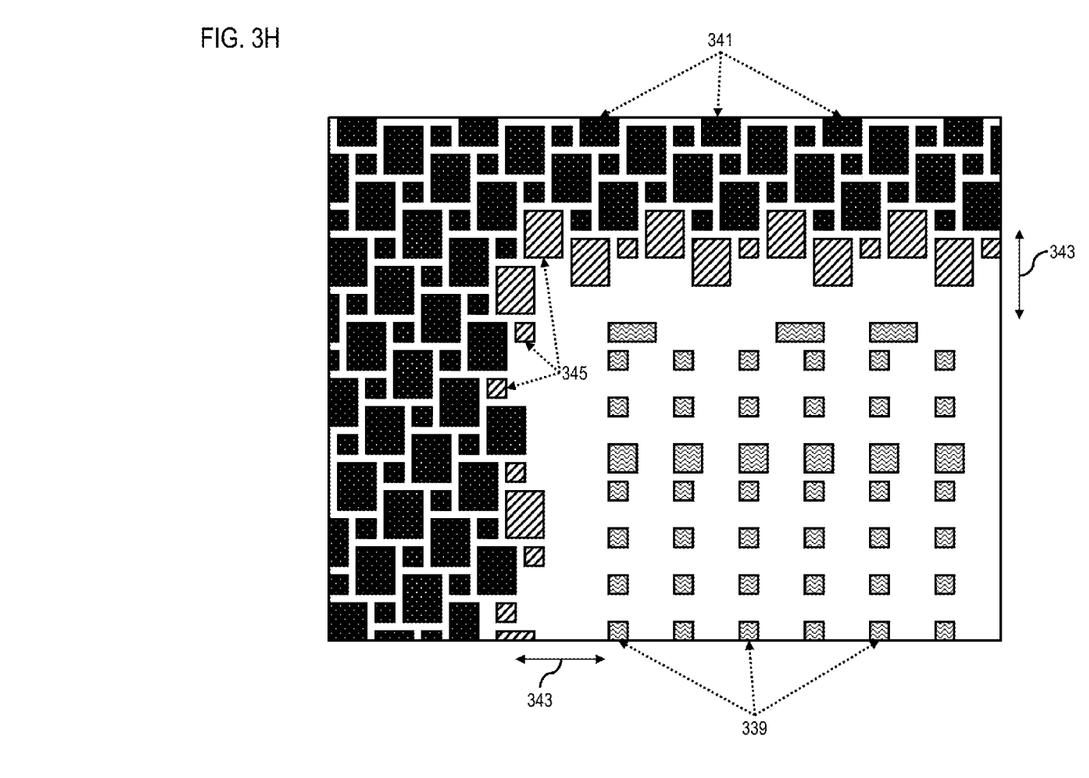

FIG. 3G illustrates grid 335 and diffusion regions 337 prior to the snapping process. As shown, many of the diffusion regions 337 have vertical edges that are not aligned with the parallel lines of the grid 335. However, as discussed, the snapping process will cause the vertical edges of the diffusion regions 337 to become aligned with the parallel grid lines. FIG. 3H illustrates that a diffusion layer of a planar CMOS design may include both drawn diffusion regions 339 and dummy fill diffusion regions 341. However, a fill algorithm for a CMOS process might not be adequate for a three-dimensional FinFET device process. Thus, keep-away rules may need to be modified to improve process density and to enhance the chemical mechanical polishing (CMP) process. For example, typical 20 nm CMOS designs have a keep-away region with a distance of 652 nm between drawn diffusion regions and dummy fill diffusion regions. In this case, indicators 343 illustrate the distance between the drawn diffusion regions 339 and the dummy fill diffusion regions 341. As shown, additional dummy fill diffusion regions 345 are generated for the keep-away region between the drawn diffusion regions 339 and the dummy fill diffusion regions 341, for instance, to improve the process density by reducing the keep-away region through a decrease in the keep-away distance (e.g., decreasing the keep-away distance to the keep-away distance of the universal fin mandrels and the exclusion regions).

FIG. 4 schematically illustrates a computer system 400 upon which an exemplary embodiment of the invention may be implemented. Computer system 400 may, for instance, be programmed (e.g., via computer program code or instructions) to provide conversion of a planar design to a FinFET design as described herein and may include a communication mechanism such as a bus 401 for passing information between other internal and external components of the computer system 400. Moreover, computer system 400 may include a processor (or multiple processors) 403 for performing a set of operations on information as specified by computer program code related to providing conversion of a planar design to a FinFET design. Computer system 400 may also include memory 405 coupled to bus 401. The memory 405 may, for instance, include dynamic storage, static storage, or a combination thereof for storing information including processor instructions for providing conversion of a planar design to a FinFET design.

By way of example, based on computer program code in memory 405, processor 403 may interact with communication interface 407 to receive a planar design having a plurality of diffusion regions. Processor 403 may then work with converter 409 to overlap a plurality of parallel fin mandrels with a plurality of evenly-spaced parallel lines of a grid (e.g., the global grid), for instance, by centering each of the parallel fin mandrels over a different line of the parallel lines. Converter 409 may also snap the diffusion regions to the grid based on the parallel lines. The snapping of the diffusion to the grid may, for instance, include cropping of the diffusion regions until each edge of the diffusion region perpendicular to the poly orientation (or parallel to the parallel lines) "snap" onto one of the parallel lines. In addition, the snapping may include automatic removal of diffusion regions having edges parallel to the poly orientation with edge lengths less than the spacing length between the parallel lines (e.g., if the spacing length is 48 nm, and a diffusion region has edges parallel to the poly orientation with edge lengths less than 48 nm, the diffusion region will automatically be removed). As such, the converter 409 may generate a FinFET design based on the overlapping and the snapping.

It is noted that, in various aspects, some or all of the techniques described herein are performed by computer system 400 in response to processor 403 executing one or more sequences of one or more processor instructions contained in memory 405. Such instructions, also called computer instructions, software and program code, may be read into memory 405 from another computer-readable medium such as a storage device or a network link. Execution of the sequences of instructions contained in memory 405 causes processor 403 to perform one or more of the method steps described herein. In alternative embodiments, hardware, such as application-specific integrated circuits (ASICs), may be used in place of or in combination with software to implement the invention. Thus, embodiments of the invention are not limited to any specific combination of hardware and software, unless otherwise explicitly stated herein.

The embodiments of the present disclosure can achieve several technical effects, including reduced design costs, early FinFET performance assessment (e.g., via electrical results extraction from processed silicon), etc. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   receiving a planar design having a plurality of diffusion regions;
   overlapping a plurality of parallel fin mandrels with a plurality of evenly-spaced parallel lines of a grid;
   snapping the diffusion regions to the grid based on the parallel lines; and
   generating, by at least one processor, a FinFET design based on the overlapping and the snapping.

2. The method according to claim 1, wherein the parallel lines and the parallel fin mandrels are perpendicular to a poly orientation associated with the planar design.

3. The method according to claim 2, further comprising:
   determining a spacing length between the parallel lines;
   determining a plurality of edges of the diffusion regions that are parallel to the poly orientation; and
   cropping the diffusion regions until each of the edges has a length that is a multiple of the spacing length, wherein the snapping is additionally based on the cropped diffusion regions.

4. The method according to claim 3, further comprising:
   determining that at least one of the edges has an edge length less than the spacing length; and removing at least one of the diffusion regions having the at least one edge.

5. The method according to claim 3, wherein the spacing length is 40 nm to 50 nm.

6. The method according to claim 1, further comprising:
   drawing an exclusion region that replaces at least one of the diffusion regions; and drawing a plurality of other parallel fin mandrels within the exclusion region, wherein the generation of the FinFET design is additionally based on the drawing of the other parallel fin mandrels and the exclusion region.

7. The method according to claim 6, further comprising:
determining a keep-away region of the exclusion region based on a keep-away distance of the exclusion region; and
removing portions of the fin mandrels that are within the keep-away region, wherein the generation of the FinFET design is additionally based on the removal of the fin mandrel portions.

8. The method according to claim 7, wherein the diffusion regions comprise drawn diffusion regions and dummy fill diffusion regions, the method further comprising:
determining another keep-away region separating the drawn diffusion regions from the dummy fill diffusion regions; and
generating additional dummy fill diffusion regions in the another keep-away region, the additional dummy fill diffusion regions being spaced from the drawn diffusion regions by at least the keep away distance, wherein the generation of the FinFET design is additionally based on the additional dummy fill diffusion regions.

9. The method according to claim 7, wherein the keep-away distance is 250 nm to 700 nm.

10. The method according to claim 1, further comprising:
overlapping the parallel fin mandrels with the parallel lines by centering each of the parallel fin mandrels over a different line of the parallel lines.

11. An apparatus comprising:
a processor; and
a memory including computer program code for one or more programs,
the memory and the computer program code configured to, with the processor, cause the apparatus to perform at least the following:
receive a planar design having a plurality of diffusion regions;
overlap a plurality of parallel fin mandrels with a plurality of evenly-spaced parallel lines of a grid;
snap the diffusion regions to the grid based on the parallel lines; and
generate a FinFET design based on the overlapping and the snapping.

12. The apparatus according to claim 11, wherein the parallel lines and the parallel fin mandrels are perpendicular to a poly orientation associated with the planar design, and the apparatus is further caused to:
determine a spacing length between the parallel lines;
determine a plurality of edges of the diffusion regions that are parallel to the poly orientation; and
crop the diffusion regions until each of the edges has a length that is a multiple of the spacing length, wherein the snapping is additionally based on the cropped diffusion regions.

13. The apparatus according to claim 12, wherein the apparatus is further caused to:
determine that at least one of the edges has an edge length less than the spacing length; and
remove at least one of the diffusion regions having the at least one edge.

14. The apparatus according to claim 11, wherein the apparatus is further caused to:
draw an exclusion region that replaces at least one of the diffusion regions; and draw a plurality of other parallel fin mandrels within the exclusion region, wherein the generation of the FinFET design is additionally based on the drawing of the other parallel fin mandrels and the exclusion region.

15. The apparatus according to claim 14, wherein the apparatus is further caused to:
determine a keep-away region of the exclusion region based on a keep-away distance of the exclusion region; and
remove portions of the fin mandrels that are within the keep-away region, wherein the generation of the FinFET design is additionally based on the removal of the fin mandrel portions.

16. The apparatus according to claim 15, wherein the diffusion regions comprise drawn diffusion regions and dummy fill diffusion regions, and wherein the apparatus is further caused to:
determine another keep-away region separating the drawn diffusion regions from the dummy fill diffusion regions; and
generate additional dummy fill diffusion regions in the another keep-away region, the additional dummy fill diffusion regions being spaced from the drawn diffusion regions by at least the keep away distance, wherein the generation of the FinFET design is additionally based on the additional dummy fill diffusion regions.

17. A method comprising:
receiving a planar design having a diffusion layer that includes a plurality of diffusion regions;
overlaying a grid and the diffusion layer, wherein the grid has a plurality of evenly-spaced parallel lines that are perpendicular to a poly orientation associated with the planar design;
overlapping a plurality of parallel fin mandrels with the parallel lines, wherein the parallel fin mandrels are parallel to the parallel lines;
snapping the diffusion regions to the grid based on the parallel lines; and
generating, by at least one processor, a FinFET design based on the overlapping and the snapping.

18. The method according to claim 17, further comprising:
determining a spacing length between the parallel lines;
determining a plurality of edges of the diffusion regions that are parallel to the poly orientation; and
cropping the diffusion regions until each of the edges has an edge length that is a multiple of the spacing length, wherein the snapping is additionally based on the cropped diffusion regions.

19. The method according to claim 17, further comprising:
drawing an exclusion region that replaces at least one of the diffusion regions;
manually drawing a plurality of other parallel fin mandrels within the exclusion region;
determining a keep-away region of the exclusion region based on a keep-away distance of the exclusion region; and
removing portions of the fin mandrels that are within the keep-away region, wherein the generation of the FinFET design is additionally based on the drawing of the other parallel fin mandrels and the exclusion region, and the removal of the fin portions.

20. The method according to claim 19, wherein the diffusion regions comprise drawn diffusion regions and dummy fill diffusion regions, the method further comprising:
determining another keep-away region separating the drawn diffusion regions from the dummy fill diffusion regions; and generating additional dummy fill diffusion regions in the another keep-away region, the additional dummy fill diffusion regions being spaced from the drawn diffusion regions by at least the keep away distance, wherein the generation of the FinFET design is additionally based on the additional dummy fill diffusion regions.

* * * * *